United States Patent
Blanquart

(10) Patent No.: US 12,293,942 B2
(45) Date of Patent: *May 6, 2025

(54) METHODS FOR DEPOSITING GAP FILLING FLUIDS AND RELATED SYSTEMS AND DEVICES

(71) Applicant: ASM IP Holding B.V., Almere (NL)

(72) Inventor: Timothee Blanquart, Oud-Heverlee (BE)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/374,832

(22) Filed: Sep. 29, 2023

(65) Prior Publication Data

US 2024/0030064 A1    Jan. 25, 2024

Related U.S. Application Data

(63) Continuation of application No. 17/157,467, filed on Jan. 25, 2021, now Pat. No. 11,776,846.

(60) Provisional application No. 62/971,686, filed on Feb. 7, 2020.

(51) Int. Cl.
| | |
|---|---|
| H01L 21/768 | (2006.01) |
| C23C 16/34 | (2006.01) |
| C23C 16/455 | (2006.01) |
| C23C 16/52 | (2006.01) |
| H01J 37/32 | (2006.01) |
| H01L 21/02 | (2006.01) |

(52) U.S. Cl.
CPC ...... *H01L 21/76837* (2013.01); *C23C 16/345* (2013.01); *C23C 16/45536* (2013.01); *C23C 16/45544* (2013.01); *C23C 16/52* (2013.01); *H01J 37/32449* (2013.01); *H01J 37/32834* (2013.01); *H01J 37/32899* (2013.01); *H01L 21/02211* (2013.01); *H01L 21/02274* (2013.01); *H01L 21/0234* (2013.01); *H01J 2237/332* (2013.01)

(58) Field of Classification Search
None
See application file for complete search history.

(56) References Cited

U.S. PATENT DOCUMENTS

| | | |
|---|---|---|
| 7,498,273 B2 | 3/2009 | Mallick |
| 7,651,959 B2 | 1/2010 | Fukazawa |
| 8,003,174 B2 | 8/2011 | Fukazawa |
| 8,728,958 B2 | 5/2014 | Ashtiani |
| 8,809,161 B2 | 8/2014 | Gauri |
| 8,846,536 B2 | 9/2014 | Draeger |
| 9,484,389 B2 | 11/2016 | Wouters et al. |
| 9,916,977 B2 | 3/2018 | Van Cleemput |
| 10,316,407 B2 | 6/2019 | Lei et al. |
| 11,482,412 B2 | 10/2022 | Blanquart |
| 11,776,846 B2 * | 10/2023 | Blanquart ............... C23C 16/56 438/758 |
| 2005/0179112 A1 | 8/2005 | Belyansky |

(Continued)

FOREIGN PATENT DOCUMENTS

KR    2006001154 A    2/2006

*Primary Examiner* — Asok K Sarkar
(74) *Attorney, Agent, or Firm* — Snell & Wilmer L.L.P.

(57) ABSTRACT

Methods and systems for manufacturing a structure comprising a substrate. The substrate comprises plurality of recesses and a plurality of lateral spaces. The recesses and lateral spaces are at least partially filled with a gap filling fluid.

18 Claims, 6 Drawing Sheets

(56) References Cited

U.S. PATENT DOCUMENTS

| | | |
|---|---|---|
| 2013/0217240 A1 | 8/2013 | Mallick et al. |
| 2013/0217241 A1 | 8/2013 | Underwood |
| 2017/0114465 A1 | 4/2017 | Kalutarage |

* cited by examiner

METHODS FOR DEPOSITING GAP FILLING FLUIDS AND RELATED SYSTEMS AND DEVICES

CROSS-REFERENCE TO RELATED APPLICATIONS

This application is a continuation of, and claims priority to, U.S. patent application Ser. No. 17/157,467 filed Jan. 25, 2021 titled METHODS FOR DEPOSITING GAP FILLING FLUIDS AND RELATED SYSTEMS AND DEVICES; which claims the benefit of U.S. Provisional Patent Application Ser. No. 62/971,686 filed Feb. 7, 2020 titled METHODS FOR DEPOSITING GAP FILLING FLUIDS AND RELATED SYSTEMS AND DEVICES; the disclosures of which are hereby incorporated by reference in their entirety.

FIELD OF INVENTION

The present disclosure generally relates to methods and systems suitable for forming electronic devices. More particularly, the disclosure relates to methods and systems that can be used for depositing a gap filling fluid in trenches and lateral spaces by plasma-assisted deposition.

BACKGROUND OF THE DISCLOSURE

The scaling of semiconductor devices has led to significant improvements in speed and density of integrated circuits. However, with miniaturization of wiring pitch of large scale integration devices, void-free filling of high aspect ratio trenches (e.g., trenches having an aspect ratio of three or higher) becomes increasingly difficult due to limitations of existing deposition processes. Therefore, there remains a need for processes that efficiently fill high aspect ratio features, such as trenches, on semiconductor substrates. There further remains a need for processes that can additionally fill buried spaces below a substrate surface.

One gap fill method is disclosed in International Publication No. WO 2019/152055. However, this method does not disclose the filling of buried layers with a gap filling fluid.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

Various embodiments of the present disclosure relate to gap filling methods, to structures and devices formed using such methods, and to apparatus for performing the methods and/or for forming the structure and/or devices. The ways in which various embodiments of the present disclosure address drawbacks of prior methods and systems are discussed in more detail below.

Provided herein is a method of filling a gap comprising: introducing in a reactor chamber a substrate provided with a gap, the gap comprising a recess and a lateral space extending substantially laterally from the recess; introducing a precursor into the reactor chamber; introducing a co-reactant into the reactor chamber; and, introducing a plasma in the reactor chamber; whereby the precursor and the co-reactant react to form a gap filling fluid that at least partially fills the recess and the lateral space of the gap.

In some embodiments, the co-reactant comprises nitrogen and/or ammonia.

In some embodiments, the co-reactant comprises a noble gas.

In some embodiments, the noble gas is selected from the list consisting of He, Ne, Ar, and Kr.

In some embodiments, the noble gas is Ar.

In some embodiments, the precursor is a cyclosilazane precursor.

In some embodiments, the reactor chamber is at a pressure of at least 700 Pa to at most 1,500 Pa and at a temperature of at least 50° C. to at most 150° C.

In some embodiments, the reactor chamber is at a pressure of at least 900 Pa to at most 1,200 Pa.

In some embodiments, the reactor chamber is at a temperature of at least 50° C. to at most 75° C.

In some embodiments, the cyclosilazane precursor is selected from the group consisting of a cyclotrisilazane precursor, a cyclotetrasilazane precursor, and a cyclopentasilazane precursor.

In some embodiments, the cyclosilazane precursor has the following formula:

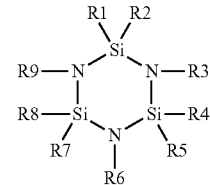

wherein any one of R1 to R9 are each independently selected from the group consisting of hydrogen and C1 to C5 branched or linear alkyl, alkenyl, alkynyl, and alkylamine.

In some embodiments, the precursor and the co-reactant are introduced simultaneously.

In some embodiments, introducing the co-reactant is provided continuously, the precursor is provided in a plurality of precursor pulses, the plasma is provided in a plurality of plasma pulses, wherein individual precursor pulses and individual plasma pulses are separated by purge steps.

In some embodiments, the cyclosilazane precursor consists entirely of N, C, H, and Si.

In some embodiments, the cyclosilazane precursor consists entirely of N, C, and Si.

In some embodiments, the cyclosilazane precursor does not contain any oxygen.

In some embodiments, the cyclosilazane precursor does not contain any halogens.

In some embodiments, no gasses other than the cyclosilazane precursor, ammonia, and nitrogen are introduced into the reactor chamber throughout introducing the precursor, the co-reactant and the plasma.

In some embodiments, the substrate comprises a semiconductor.

In some embodiments, the method includes entirely filling the plurality of recesses with a gap filling fluid.

In some embodiments, the method includes entirely filling the one or more lateral spaces with a gap filling fluid.

In some embodiments, the method comprises curing the gap filling fluid.

In some embodiments, the step of curing involves the use of a direct plasma and the method for filling a gap comprises a plurality of cycles in which gap filling fluid deposition and plasma treatment steps are alternated.

In some embodiments, the step of curing involves the use of an indirect plasma after the gap has been filled with the gap filling fluid.

In some embodiments, the step of curing involves the use of a noble gas plasma.

In some embodiments, the step of curing involves the use of a micro pulsed plasma involving the sequential application of a plurality plasma on and plasma off pulses.

In some embodiments, the step of curing comprises subjecting the substrate to a micro pulsed plasma comprising a sequential application of a plurality of micro pulse cycles, a micro pulse cycle comprising a plasma on pulse and a plasma off pulse.

In some embodiments, the micro pulsed plasma employs a noble gas as a plasma gas.

In some embodiments, the substrate is a 300 mm silicon wafer, and a plasma gas flow rate of at least 5.0 slm is maintained during the micro pulsed plasma.

Further described herein is a structure comprising a semiconductor substrate provided with a gap comprising a recess and a lateral space extending laterally from the recess; wherein the recess and the lateral space are at least partially filled with a gap filling fluid.

In some embodiments, the lateral space has a height of at least 1.0 nm to at most 40.0 nm, or at least 2.0 nm to at most 20.0 nm, or of at least 3.0 nm to at most 18.0 nm, or of at least 4.0 nm to at most 16.0 nm, or of at least 5.0 nm to at most 15.0 nm, or of at least 6.0 nm to at most 14.0 nm, or of at least 7.0 nm to at most 13.0 nm, or of at least 8.0 nm to at most 12.0 nm, or of at least 9.0 nm to at most 11.0 nm, or of about 10.0 nm.

In some embodiments, the gap filling fluid extends in the lateral space for a distance of at least 1.0 nm to at most 100.0 nm, or from at least 1.5 nm to at most 50.0 nm, or from a distance of at least 2.0 nm to at most 25.0 nm, or from a distance of at least 3.0 nm to at most 20.0 nm, or from a distance of at most 4.0 nm to at most 18.0 nm, or from a distance of at least 5.0 nm to at most 16.0 nm, or from a distance of at least 6.0 nm to at most 14.0 nm, or from a distance of at least 8.0 nm to at most 12.0 nm, or for a distance of about 10.0 nm.

In some embodiments, the gap filling fluid comprises a polysilazane oligomer.

In some embodiments, the polysilazane oligomer is branched.

In some embodiments, the polysilazane oligomer comprises a plurality of oligomeric species.

In some embodiments, the gap filling fluid completely fills at least 90%, preferably at least 95%, more preferably at least 99%, most preferably all of the recesses.

In some embodiments, the gap filling fluid completely fills at least 90%, preferably at least 95%, more preferably at least 99%, most preferably all of the lateral space.

In some embodiments, the gap filling fluid is substantially free of voids.

In some embodiments, the gap filling fluid extends in the one or more lateral space for a distance of at least 3 nm.

In some embodiments, the recess has a depth of at least 5 nm to at most 500 nm, or of at least 10 nm to at most 250 nm, or from at least 20 nm to at most 200 nm, or from at least 50 nm to at most 150 nm, or from at least 100 nm to at most 150 nm.

In some embodiments, the recess has a width of at least 10 nm to at most 10,000 nm, or of at least 20 nm to at most 5,000 nm, or from at least 40 nm to at most 2,500 nm, or from at least 80 nm to at most 1,000 nm, or from at least 100 nm to at most 500 nm, or from at least 150 nm to at most 400 nm, or from at least 200 nm to at most 300 nm.

In some embodiments, the recess has a length of at least 10 nm to at most 10,000 nm, or of at least 20 nm to at most 5,000 nm, or from at least 40 nm to at most 2,500 nm, or from at least 80 nm to at most 1000 nm, or from at least 100 nm to at most 500 nm, or from at least 150 nm to at most 400 nm, or from at least 200 nm to at most 300 nm.

In some embodiments, the lateral space, wherein the lateral space are provided in the source and/or drain regions of gate-all-around transistors, and wherein the gap filling fluid serves as an interlayer dielectric.

In some embodiments, the gap filling fluid is cured.

Further described is structure including a gap filled according to a method as described herein.

Further described is a gate all around transistor comprising a gap filling fluid as an interlayer dielectric. In some embodiments, the gap filling fluid is cured.

Further described herein is a system configured to perform a method for filling a gap as described herein, and/or configured to form a structure comprising a filled gap, as described herein.

Further described herein is a system comprising: one or more reaction chambers; a gas injection system fluidly coupled to at least one of the one or more reaction chambers; a first gas source for introducing a precursor and optionally a carrier gas in the reactor chamber; a second gas source for introducing a mixture of one or more further gasses into the reactor chamber; an exhaust; and a controller. The controller is configured to control gas flow into the gas injection system to carry out a method for filling a gap as described herein.

In accordance with yet additional examples of the disclosure, a system to perform a method as described herein and/or to form a structure, device, or portion thereof either is disclosed.

In accordance with yet additional examples of the disclosure, a controller arranged for processing instructions for carrying out a method as described herein and/or for manufacturing a structure, device, or portion thereof, is disclosed.

In accordance with yet additional examples of the disclosure, a data carrier having stored thereon computer-readable instructions for carrying out a method as described herein and/or for manufacturing a structure, device, or portion thereof, is disclosed.

These and other embodiments will become readily apparent to those skilled in the art from the following detailed description of certain embodiments having reference to the attached figures. The invention is not being limited to any particular embodiments disclosed.

BRIEF DESCRIPTION OF THE DRAWING FIGURES

A more complete understanding of the embodiments of the present disclosure may be derived by referring to the detailed description and claims when considered in connection with the following illustrative figures.

Figure 1:
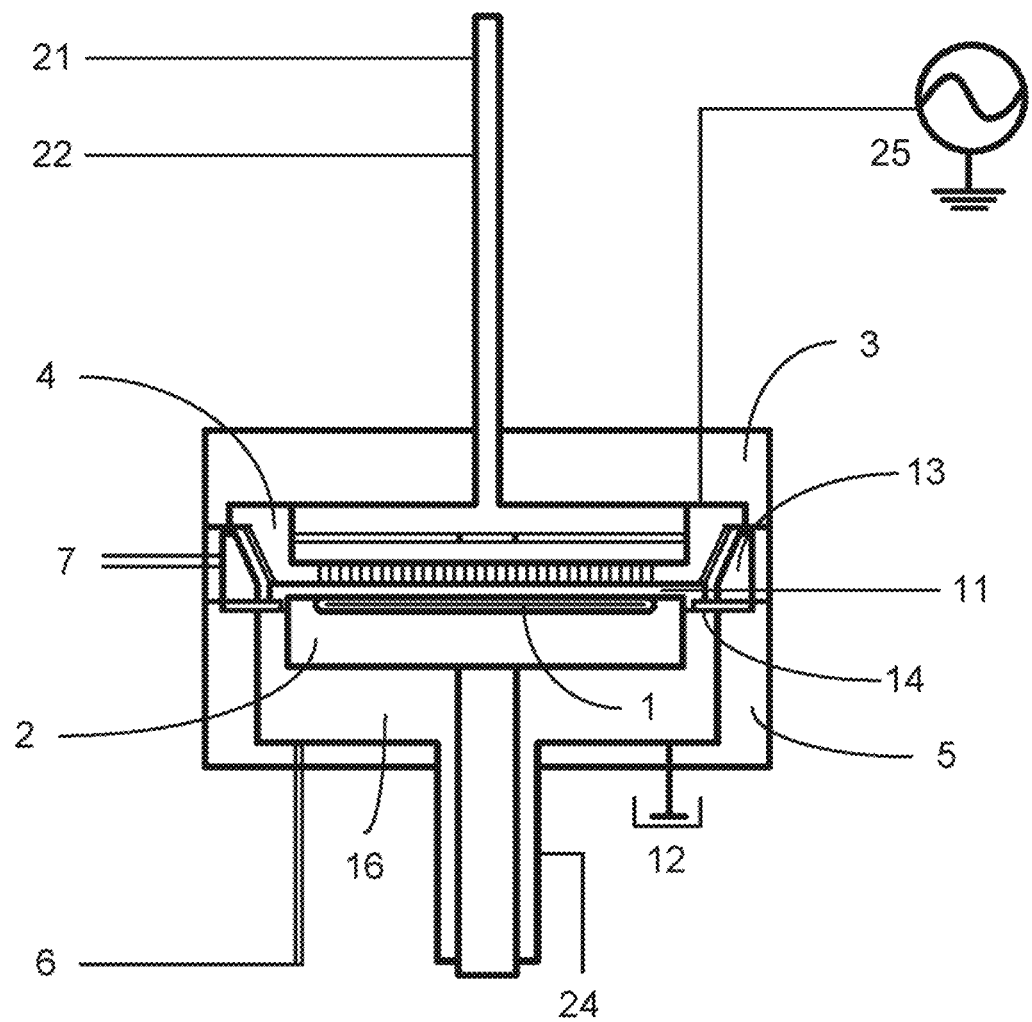
FIG. 1 is a schematic representation of a plasma-enhanced atomic layer deposition (PEALD) apparatus suitable for depositing a structure and/or for performing a method in accordance with at least one embodiment of the present disclosure.

Throughout the figures, the following numbers and symbols are used: 100—test structure; 110—gap filling fluid; 120—silicon oxide; 130—lateral space; 135—silicon nitride; 140—trench; $w_t$—width of trench; $h_v$—height of lateral space; $w_v$—width of lateral space; $h_t$—height of trench; $T_t$—thickness of gap fill fluid deposited on the top of a sample; $T_b$—thickness of gap fill fluid deposited in the bottom of a trench.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, devices and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, a multi-port injection system, other gas distribution device, or the like, can be used for, e.g., sealing the reaction space, and can include a seal gas, such as a rare gas. The terms "rare gas" and "noble gas" as used herein may be used interchangeably. In some cases, the term "precursor" can refer to a compound that participates in the chemical reaction that produces another compound, and particularly to a compound that constitutes a film matrix or a main skeleton of a film; the term "reactant" may be used interchangeably with the term precursor.

As used herein, the term "co-reactant" refers to a gas which reacts and/or interacts with a precursor in order to form a flowable gap fill layer as described herein. The co-reactant may activate the precursor oligomerization. The co-reactant may be a catalyst. The co-reactant does not necessarily have to be incorporated in the gap filling fluid which is formed, though the co-reactant does interact with the precursor during formation of the gap filling fluid. Possible co-reactants include He, Ar, $N_2$, $H_2$, and $NH_3$. Alternative expressions for the term "co-reactant" as used herein may include "gas mixture," "one or more further gasses," and "gas mixture comprising one or more further gasses."

As used herein, the term "substrate" can refer to any underlying material or materials that can be used to form, or upon which, a device, a circuit, or a film can be formed. A substrate can include a bulk material, such as silicon (e.g., single-crystal silicon), other Group IV materials, such as germanium, or other semiconductor materials, such as a Group II-VI or Group III-V semiconductor, and can include one or more layers overlying or underlying the bulk material.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

As used herein, the term "comprising" indicates that certain features are included, but that it does not exclude the presence of other features, as long as they do not render the claim unworkable. In some embodiments, the term "comprising" includes "consisting."

As used herein, the term "consisting" indicates that no further features are present in the apparatus/method/product apart from the ones following said wording.

As used herein, the term "gap filling fluid," also referred to as "flowable gap fill," may refer to an oligomer which is liquid under the conditions under which is deposited on a substrate and which has the capability to cross link and for a solid film.

In this disclosure, the term "filling capability" refers to a capability of filling a gap substantially without voids (e.g., no void having a size of approximately 5 nm or greater in diameter) and seams (e.g., no seam having a length of approximately 5 nm or greater), wherein seamless/void-less bottom-up growth of a layer is observed. The growth at a bottom of a gap may be at least approximately 1.5 times faster than growth on sidewalls of the gap and on a top surface having the gap. A film having filling capability is referred to as "flowable film" or "viscous film." The flowable or viscous behavior of a film is often manifested as a concave surface at a bottom of a trench.

In this disclosure, a recess between adjacent protruding structures and any other recess pattern may be referred to as a "trench." That is, a trench may refer to any recess pattern including a hole/via. A trench can have, in some embodiments, a width of about 20 nm to about 100 nm, and typically about 30 nm to about 50 nm. When a trench has a length that is substantially the same as its width, it can be referred to as a hole or a via. Holes or vias typically have a width of about 20 nm to about 100 nm. In some embodiments, a trench has a depth of about 30 nm to about 100 nm, and typically of about 40 nm to about 60 nm. In some embodiments, a trench has an aspect ratio of about 2 to about 10, and typically of about 2 to about 5. The dimensions of the trench may vary depending on process conditions, film composition, intended application, etc.

Figure 3:
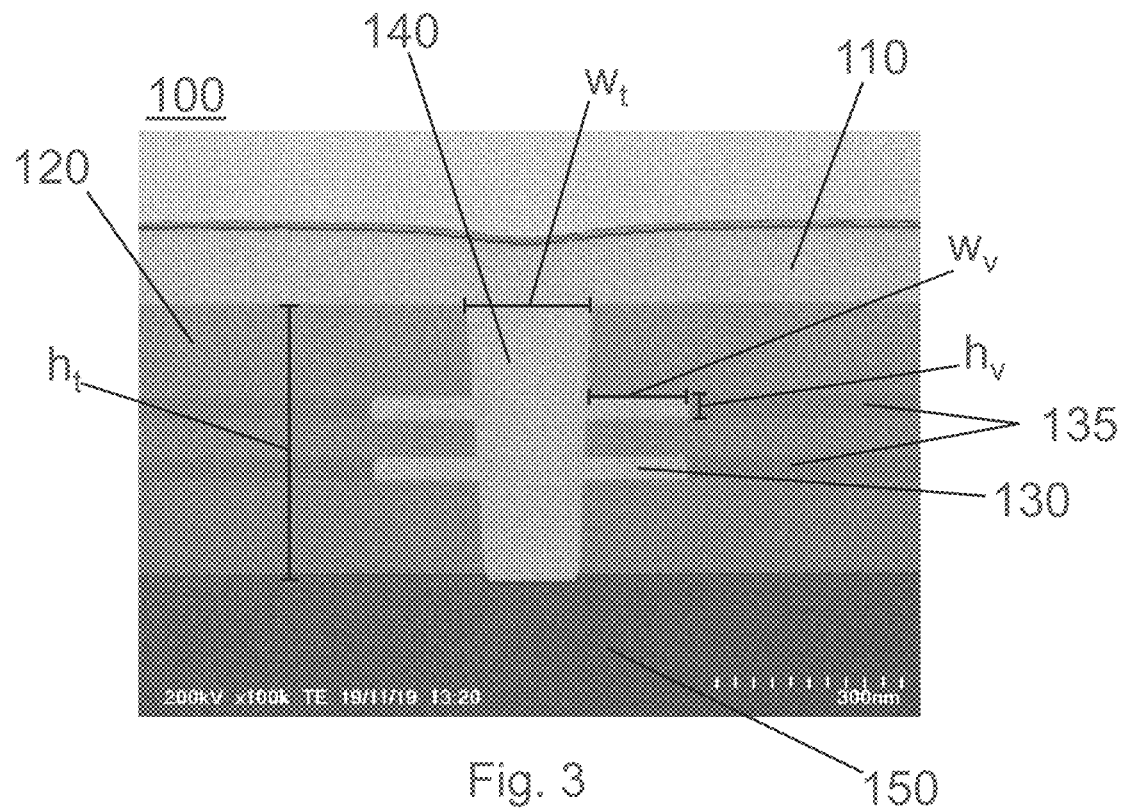
FIG. 3 is a scanning transmission electron microscope (STEM) micrograph of a test structure (100) comprising a trench (140), unfilled lateral space (130), and gap filling fluid in lateral space (131).

As used herein, the term "lateral space" may refer to an opening in a semiconductor substrate which is in fluid connection with its surface, and for which there exists no straight path to the wafer surface which is perpendicular to the wafer plane. In other words, a lateral space refers to a sub-surface space in a semiconductor wafer. Stated yet differently, a lateral space is an opening which is covered, but not completely enclosed, by a substrate. For example, FIG. 3 shows a test structure comprising a lateral space (130) which is filled with a gap filling fluid. The trench (140) shown in FIG. 3 is not a lateral space because it is not covered by a substrate surface. A lateral space can be filled with a gap filling fluid according to the methods described herein. Alternatively, a "lateral space" can also be named a "buried lateral layer," a "buried layer," a "buried space," a "buried lateral space," a "capped space," or a like term.

As used herein, the term "height" may refer to the extent of a feature in a plane perpendicular to the surface of the substrate that comprises the feature in question.

As used herein, the term "width" may refer to the extent of a feature in a direction in a plane parallel to the surface of the substrate that comprises the feature in question.

As used herein, the term "length" may refer to the extent of a feature in a direction in a plane parallel to the surface of the substrate that comprises the feature in question. The directions in which the "width" and the "length" are measured are mutually perpendicular. It shall be understood that all dimensions, including length, width, and height of a structure, can be measured using routine techniques such as scanning tunneling electron microscopy (STEM).

As used herein, the term "lateral" may refer to a feature or direction that extents in the plane of the substrate that comprises the feature in question.

As used herein, the expression "lateral direction" may refer to a direction that extends in a direction of the plane of the wafer.

An object of the present invention is to provide a method for forming a film comprising silicon, nitrogen, and optionally carbon that has filling capability. Also provided are films resulting from such a method, and structures including such films. In some embodiments, the filling capability can be accomplished by forming a viscous material in a gas phase by striking, for example, an $N_2$ and/or $NH_3$ plasma, in a chamber filled with a volatile precursor that can be polymerized within certain parameter ranges. Optionally the gas phase comprises a further gas apart from $N_2$ and/or $NH_3$, for example a noble gas or $H_2$. The parameters can include, for example, partial pressure of precursor during a plasma strike and wafer temperature. As used herein, polymerization can include formation of a longer molecule and need not necessarily include a carbon-carbon bond. Indeed, polymerization can include formation of for example Si—Si bonds, Si—C bonds, and/or Si—N bonds. The viscous material forms a viscous phase on the bottom of a substrate and is capable of flowing in a trench on that substrate. Suitable substrates include silicon wafers. As a result, the viscous material seamlessly fills the trench in a bottom-up way.

Flowable films may be temporarily obtained when a volatile precursor, for example an alkylsilane or the like, is polymerized by a plasma and deposited on a surface of a substrate, wherein gaseous precursor (e.g., monomer) is activated or fragmented by energy provided by plasma gas discharge so as to initiate polymerization, and when the resultant material is deposited on the surface of the substrate, the material shows temporarily flowable behavior. In accordance with exemplary embodiments, when the deposition step is complete, the flowable film is no longer flowable but is solidified, and thus, a separate solidification process is not required. In other embodiments, the flowable film is densified and/or solidified after deposition.

The gap filling fluids that are deposited herein may comprise hydrogen, though there is no requirement that they do so. In some embodiments, the gap filling fluids that are deposited herein comprise between 0.1% and 10.0%, or between 0.2% and 5.0%, or between 0.5% and 2.5%, or between 1.0% and 2.0% hydrogen, wherein all percentages are given in atomic percent. Hence, when, for example, a gap filling fluid is referred to as SiCN, the breath of the term "SiCN" is intended to encompass SiCN:H, i.e., SiCN comprising hydrogen, e.g., up to 10 atomic percent hydrogen.

In some embodiments, a volatile precursor is polymerized within a certain parameter range mainly defined by partial pressure of precursor during a plasma strike, wafer temperature, and total pressure in the reaction chamber. In order to adjust the "precursor partial pressure," an indirect process knob (dilution gas flow) may be used to control the precursor partial pressure. The absolute number of precursor partial pressure may not be required in order to control flowability of deposited film, and instead, a ratio of flow rate of precursor to flow rate of the remaining gas and the total pressure in the reaction space at a reference temperature can be used as practical control parameters.

A gap in a substrate may refer to a patterned recess or trench in a substrate. Accordingly, exemplary methods of filling a patterned recess or trench on a substrate include providing a substrate comprising the recess/trench in a reaction space, providing a precursor to the reaction space, thereby filling the recess with the precursor, and providing a plasma to form a viscous phase of the precursor in the recess, wherein the viscous phase of the precursor flows and deposits or forms deposited material in the bottom portion of the recess relative to sidewalls and/or a top portion of the substrate away from the recess.

The present methods are particularly applicable for filling gaps comprising lateral spaces which are in fluid connection with recesses. Thus, provided herein is a method for manufacturing a structure. The structure comprises a substrate which in turn comprises a plurality of recesses and a plurality of lateral spaces. The substrate preferably comprises a semiconductor. Suitable substrates include semiconductor wafers, for example silicon wafers. The plurality of recesses are in fluid connection with one or more lateral spaces. The method comprises the step of at least partially filling the plurality of recesses and the one or more lateral spaces with a gap filling fluid.

Alternatively or additionally, provided herein are methods for filling a gap by means of a gap filling fluid. These methods comprise introducing a substrate in a reactor chamber. The substrate is provided with a gap. The gap comprises a recess and a lateral space extending substantially laterally from the recess. After the substrate has been introduced in the chamber, the method includes introducing a precursor into the reactor chamber as well as introducing a co-reactant into the reactor chamber. The method further comprises creating a plasma in the reactor chamber. Upon application of the plasma, the precursor and the co-reactant react to form a gap filling fluid that at least partially fills the recess and the lateral space of the gap.

Thus gaps comprising lateral spaces in a substrate can be effectively filled.

In some embodiments, present methods include the use of a radio frequency (RF) plasma and make used of pulsed precursor flow and a pulsed RF plasma. Preferably, the precursor pulses and the plasma pulses are separated by purge gas pulses. Preferably, the co-reactant is used as a purge gas. In such embodiments, the desired aspects for flowability of depositing film include: 1) high enough partial pressure during the entire RF-on period for polymerization to progress; 2) sufficient energy to activate the reaction (defined by the RF-on period and RF power), during an RF period which is not too long; and 3) temperature and pressure for polymerization/chain growth set above the melting point and below the boiling point of the flowable phase.

In some embodiments, the process of filling a gap with a gap filling fluid comprises the following sub-steps. In step a., a substrate comprising the gap is positioned in a reactor chamber. The gap comprises a recess in fluid connection with one or more lateral spaces. Step b. includes introducing a precursor into the reactor. Step c. includes introducing a gas mixture comprising one or more further gases into the reactor. The gas mixture comprising the one or more further gases comprises the co-reactant. In some embodiments, the gas mixture comprising the one or more further gases consists of the co-reactant. Step d. includes maintaining a plasma in the reactor. Step e. includes reacting the precursor on the one hand and the nitrogen and/or ammonia on the other hand to form a gap filling fluid on the substrate. Step f. includes allowing the gap filling fluid to at least partially fill the plurality of recesses and the one or more lateral spaces.

In some embodiments, steps b and c occur simultaneously.

In some embodiments, step b precedes step c, and step c precedes step d.

In some embodiments, step c precedes step b, and step b precedes step d.

In some embodiments, all of steps b, c, and d are carried out concurrently.

It shall be understood that when steps b, c, and/or d are carried out in a sequential manner, i.e., cyclically, a small amount of material may be deposited each cycle and the sequence of steps may be repeated until a layer with a desired thickness is obtained.

In some embodiments, the process is carried out cyclically and steps b and d are separated by purge gas pulses.

In some embodiments, neither the precursor nor the co-reactant contains any chalcogens or halogens. Preferably, neither the precursor nor the co-reactant comprises oxygen or chlorine.

In some embodiments, the present methods involve providing the precursor intermittently to the reaction space, and continuously applying a plasma. In some embodiments, the present methods involve providing the precursor intermittently to the reaction space, and intermittently applying a plasma. The latter embodiments thus feature the sequential application of precursor pulses and plasma pulses to the reaction space. Preferably, the precursor pulses and the plasma pulses are separated by purge gas pulses.

In some embodiments, the present methods involve providing the precursor continuously to the reaction space, and continuously or cyclically applying a plasma, e.g., through application of RF power, throughout the deposition step. The plasma may be continuous or pulsed, and it may be direct or remote.

In a preferred mode of operation, the flowable film is deposited by employing alternating precursor and plasma pulses.

In some embodiments, a pulsed plasma, e.g., a pulsed RF plasma is applied. In some embodiments, the period of RF power application (i.e., the period in which reactants in the reactor are exposed to plasma) is in the range of at least 0.7 seconds to at most 2.0 seconds, for example from at least 0.7 seconds to at most 1.5 seconds.

In some embodiments, the plasma exposure time is adjusted by changing the distance between upper and lower electrodes. Indeed, by increasing this distance, the retention time by which the precursor is retained in the reaction space between upper and lower electrodes is prolonged when the flow rate of precursor entering into the reaction space is kept constant. In some embodiments, the distance between the upper and lower electrodes is from at least 5.0 mm to at most mm, or from at least 10.0 mm to at most 25.0 mm, or from at least 15.0 mm to at most 20.0 mm.

In some embodiments, the plasma is RF plasma. In some embodiments, RF power is provided at a frequency of 13.56 MHz. In some embodiments, the RF power provided for flowable film deposition is from at least 50 W to at most 1000 W, or from at least 100 W to at most 900 W, or from at least 200 W to at most 800 W, or from at least 300 W to at most 700 W, or from at least 400 W to at most 600 W, or from at least 500 W to at most 550 W. It shall be understood that these powers are provided for the special case of 300 mm wafers. They can be readily converted to units of $W/cm^2$ to obtain equivalent RF power values for different wafer sizes.

In preferred embodiments, the present methods involve providing the precursor in a pulse, and involve providing the RF power in a further pulse, wherein the two pulses do not overlap. Preferably, the precursor pulses and the plasma pulses are separated by purge gas pulses. Thus, in some embodiments, the method for filling a gap comprises a plurality of deposition cycles comprising alternating pulses in which precursor is provided, and pulses in which RF power is provided for generating a plasma. Preferably, these precursor pulses and plasma pulses are separated by purge pulses in which a purge gas is flowed. In the following paragraphs, process conditions are given for a reactor chamber volume of 1 liter and for 300 mm wafers. The skilled person understands that these values can be readily extended to other reactor chamber volumes and wafer sizes.

In some embodiments, the method for filling a gap comprises from at least 10 to at most 300 deposition cycles, or from at least 20 to at most 200 deposition cycles, or from at least 50 to at most 150 deposition cycles, or from at least 75 to at most 125 deposition cycles, for example 100 deposition cycles. When ammonia and/or $NH_3$ is used as co-reactant, the method for filling a gap preferably comprises from at least 10 to at most 125 deposition cycles, or from at least 25 to at most 100 deposition cycles, or from at least 50 to at most 75 deposition cycles. When Ar is used as a co-reactant, the method for filling a gap preferably comprises from at least 25 to at most 300 deposition cycles, or from at least 50 to at most 250 deposition cycles, or from at least 100 to at most 200 deposition cycles, for example 150 deposition cycles.

In some embodiments, the co-reactant is supplied to the reactor chamber as a carrier gas, i.e., as a gas that entrains the precursor, and/or as an additional gas. In some embodiments, the carrier gas is provided at a flow rate of at least 0.2 to at most 2.0 slpm, or from at least 0.3 to at most 1.5 slpm, or from at least 0.4 to at most 1.0 slpm, or from at least 0.5 to at most 0.7 slpm. In some embodiments, the co-reactant consists of $NH_3$ and/or $N_2$. Preferably, $N_2$ is used as a carrier gas. $N_2$ carrier gas is preferably provided at a flow rate of at least 0.2 to at most 2.0 slpm, or from at least 0.3 to at most 1.5 slpm, or from at least 0.4 to at most 1.0 slpm, or from at least 0.5 to at most 0.7 slpm. In some embodiments, the co-reactant consists of a noble gas, preferably Ar, and the carrier gas is provided at a flow rate of at least 0.2 slpm to at most 2.0 slpm, or from at least 0.3 slpm to at most 1.5 slpm, or from at least 0.4 slpm to at most 1.0 slpm, or at a flow rate of at least 0.6 slpm to at most 0.8 slpm.

In some embodiments, an additional $N_2$ flow is provided to the reactor chamber above and beyond the $N_2$ which is used as a carrier gas. In some embodiments, this additional $N_2$ flow is from at least 0.1 slpm to at most 2.0 slpm, or from at least 0.2 slpm to at most 1.5 slpm, or from at least 0.3 slpm to at most 1.0 slpm, or from at least 0.4 slpm to at most 0.6 slpm.

Preferably, $NH_3$ is used not as a carrier gas, but as an additional co-reactant that is separately provided to the reactor chamber. In some embodiments, $NH_3$ is provided at a flow rate of at least 0.1 slpm to 0.5 slpm, or at a flow rate of at least 0.15 slpm to at most 0.3 slpm.

In some embodiments, the pressure in the reactor chamber is from at least 700 Pa to at most 2000 Pa, or from at least 1000 Pa to at most 1800 Pa, or from at least 1300 Pa to at most 1500 Pa. This pressure range applies both when $NH_3/N_2$ is used as a carrier gas, and when a noble gas such as Ar is used as a carrier gas.

In some embodiments, the plasma is an RF plasma. In some embodiments, the RF power used is from at least 50 W to at most 1000 W, or from at least 75 W to at most 500 W, or from at least 100 W to at most 300 W, or from at least 150 W to at most 200 W. When $NH_3$ and/or $N_2$ is used as a co reactant, the RF power is from at least 200 W to at most 800 W, or from at least 250 W to at most 700 W, or from at least 300 W to at most 600 W, or from at least 400 W to at most 500 W. When Ar is used as a co-reactant, the RF power is preferably from at least 50 W to at most 200 W, or from at least 75 W to at most 150 W, or rom at least 100 W to at most 125 W.

In some embodiments, the distance between the electrodes used for generating the RF plasma is from at least 5 mm to at most 20 mm, or from at least 7 mm to at most 15 mm.

In some embodiments, the deposition cycles consist of a sequence of a precursor pulse, a precursor purge, a plasma pulse, and a post plasma purge, which are continually repeated.

In some embodiments, the duration of the precursor pulse, i.e., the precursor feed time, is from at least 0.25 s to at most 4.0 s, or from at least 0.5 s to at most 2.0 s, or from at least 1.0 s to at most 1.5 s. When a noble gas such as Ar is used as a co-reactant, the precursor feed time is preferably from at least 0.5 s to at most 1.5 s, for example 1.0 s. When $NH_3$ and/or $N_2$ are used as co-reactant, the precursor feed time is preferably from at least 0.25 s to at most 4.0 s, or from at least 0.5 s to at most 2.0 s, or from at least 1.0 s to at most 1.5 s.

In some embodiments, the duration of the purge step directly after the precursor pulse, i.e., the precursor purge time, is from at least 0.025 s to at most 2.0 s, or from at least 0.05 s to at most 0.8 s, or from at least 0.1 s to at most 0.4 s, or from at least 0.2 s to at most 0.3 s. This timing applies both for the case when $N_2$ and/or $NH_3$ is used as a co-reactant, and when a noble gas such as Ar is used as a co-reactant.

In some embodiments, the RF on time, i.e., the duration of a plasma pulse, that is the time during which RF power is provided during a plasma pulse, is from at least 0.5 s to at most 4.0 s, or from at least 0.7 s to at most 3.0 s, or from at least 1.0 s to at most 2.0 s, or from at least 1.25 s to at most 1.75 s, or of about 1.5 s. When $N_2$ and/or $NH_3$ is used as a co-reactant, the duration of a plasma pulse is preferably from at least 0.75 to at most 3.0 s, or from at least 1.0 to at most 2.0 s.

In some embodiments, the post plasma purge time, i.e., the duration of the purge which occurs after application of a plasma pulse, is from at least 0.5 s to at most 2.0 s, or from at least 0.75 to at most 1.5 s, or from at least 0.9 to at most 1.1 s, for example 1.0 s.

In some embodiments, the substrate rests on a susceptor in the reactor chamber during the deposition cycles, and the susceptor temperature is from at least 50° C. to at most 100° C., or from at least 60° C. to at most 80° C., or from at least 65° C. to at most 75° C.

The presently provided gap filling fluids spontaneously solidify after deposition through recombination. Therefore, no separate cooling step is necessary. Nevertheless, a curing step, e.g., a plasma curing step can be advantageous in order to improve one or more advantageous film properties such as resistance to shrinkage at high temperature and a low wet etch rate.

Accordingly, in some embodiments, the method includes a step of curing the gap filling fluid. This step increases the thermal resistance of the gap filling fluid. In other words, it increases the resistance of the gap filling fluid against deformation and/or mass loss at elevated temperatures. Additionally or alternatively, the curing step may cause the gap filling fluid to solidify.

In some embodiments, the method further comprises, after completion of the deposition of the film having filling capability, exposing the substrate to a plasma as a post-deposition treatment. Additionally or alternatively, a periodic plasma can be applied. Additionally or alternatively, a $H_2$ plasma, a He plasma, a $H_2$/He plasma, an Ar plasma, an Ar/$H_2$ plasma, or an Ar/He/$H_2$ plasma treatment is applied. Optionally, the gap filling fluid is subjected to an anneal after the gap filling fluid has been deposited and before the curing step. Suitable annealing times include from at least 10.0 seconds to at most 10.0 minutes, for example from at least 20.0 seconds to at most 5.0 minutes, for example from at least 40.0 seconds to at most 2.5 minutes. Suitably, the anneal is performed in a gas mixture comprising one or more gasses selected from the list consisting of $N_2$, He, Ar, and $H_2$. Preferably, the anneal is carried out in an atmosphere that comprises $N_2$. In some embodiments, the anneal is carried out at a temperature of at least 200° C., or at a temperature of at least 250° C., or at a temperature of at least 300° C., or at a temperature of at least 350° C., or at a temperature of at least 400° C., or at a temperature of at least 450° C.

Alternatively or additionally, solidification may occur upon contact with a substrate wherein this reaction is activated thermally. As for precursor gas ratio, a high precursor gas ratio is preferable for flowability, since under a low precursor partial pressure, although polymerization may occur, supply is too low to form polymer chains, which are long enough to flow, i.e., long enough to exhibit liquid-like behavior.

In some embodiments, the cured gap filling fluid is an SiCN layer. An SiCN layer may consist essentially of silicon, carbon, nitrogen, and optionally hydrogen. In some embodiments, the SiCN layer comprises more than 5 wt. % N, for example from at least 8.0 wt % N to at most 20.0 wt. % N, or from at least 10.0 wt. % N to at most 18.0 wt. % N, or from at least 12.0 wt. N to at most 15.0 wt. % N. These compositions are provided here as measured by means of Rutherford Backscattering Spectroscopy (RBS).

In some embodiments, the SiCN layer is oxidized after it has been deposited, for example in an $O_2$ plasma.

In some embodiments, the gap filling fluid is SiCN, and the gap filling fluid is subjected to an oxidation, for example in an $O_2$ plasma, after it has been deposited. Optionally, the oxidation step is carried out after the gap filling fluid has been cured. This is an advantageous way of obtaining an $SiO_2$ layer.

In some embodiments, the step of curing involves the use of a cyclic plasma treatment. When a cyclic plasma treatment is performed, deposition cycles and plasma curing cycles are alternated. The term "plasma curing cycle" refers to a plasma treatment step in which gap filling fluid is cured. In some embodiments, the cyclic plasma treatment involves the use of a gas mixture that does not comprise nitrogen.

In some embodiments, the cyclic plasma treatment, employs a direct plasma. In such embodiments, the process of filling a gap preferably comprises a plurality of cycles, i.e., plasma curing cycles, in which gap filling fluid deposition and plasma treatment steps are alternated. Such a cyclic process has the advantage that the a larger portion of the gap filling fluid is cured: a direct plasma typically has a penetration depth of around 2 to 7 nm, such that a post deposition direct plasma treatment would only cure a top layer of the gap filling fluid. Conversely, alternating deposition and plasma steps allows curing a larger part, or even the entirety of the gap filling fluid. Note that entire curing of the gap filling fluid by a cyclic plasma treatment does not occur in case the lateral spaces extend for a large lateral distance, e.g., for a lateral distance of 10.0 μm or more. This is not necessarily a problem since in many applications, potentially uncured parts of the gap filling fluid are encapsulated by cured gap filling fluid in the recess and the walls of the lateral space. In some embodiments, the direct plasma is a He plasma applied at a pressure of 600.0 Pa, for 20.0 s. When used to treat gap filling fluid on 300 mm wafers, a plasma power of 200 W is suitable.

In some embodiments, the step of curing involves the use of a remote plasma. The radicals produced by remote plasmas feature a penetration depth which is significantly higher than that offered by direct plasmas, e.g., significantly higher than the size of the gaps to be filled by means of the presently provided methods. Consequently, a remote plasma treatment may be advantageously applied once after all the gap filling fluid has been deposited. This notwithstanding, a remote plasma cure may also be applied cyclically with alternating plasma cure and gap filling fluid deposition steps, similar to the operation with a direct plasma. The large penetration depths of remote plasmas has the advantage that they allow efficient curing of gap filling fluid inside lateral spaces. In some embodiments, the plasma gas employed in a remote plasma comprises a noble gas, for example a noble gas selected from the list consisting of He and Ar.

In some embodiments, the cyclic plasma treatment involves the use of Ar and/or He as a plasma gas. In some embodiments, the cyclic plasma curing is used together with flowable gap filling fluids derived from silicon alkylamine precursors, for example silicon alkylamine precursors that are used together with co-reactants selected from the list consisting of Ar, $N_2$, and He. These gap filling fluids have excellent properties.

In some embodiments, the step of curing involves the use of a micro pulsed plasma. A micro pulsed plasma is a plasma treatment that comprises the application of a plurality of rapidly succeeding on-off micro pulses. In other words, in some embodiments, the micro pulsed plasma comprises subjecting the substrate to a micro pulsed plasma comprising a plurality of micro pulse cycles, a micro pulse cycle comprising a plasma on pulse and a plasma off pulse.

In some embodiments, the presently described methods comprise a plurality of alternating cycles, a cycle comprising a gap filling fluid deposition step and a curing step, wherein the curing step comprises subjecting the substrate to a direct plasma. Suitably, the direct plasma is a noble gas plasma. In other words, and in some embodiments, the direct plasma employs a noble gas such as Ar as a plasma gas. In some embodiments, the curing step comprises subjecting the substrate to a micro pulsed plasma comprising a plurality of micro pulse cycles, a micro pulse cycle comprising a plasma on pulse and a plasma off pulse.

For example, the on micro pulses in a micro pulsed plasma may last from at least 1.0 μs to at most 1.0 s, or from at least 2.0 μs to at most 0.50 s, or from at least 5.0 μs to at most 250 ms, or from at least 10.0 μs to at most 100.0 ms, or from at least 25.0 μs to at most 50.0 ms, or from at least 50.0 μs to at most 25.0 ms, or from at least 100.0 μs to at most 10.0 ms, or from at least 250.0 μs to at most 5.0 ms, or from at least 0.50 ms to at most 2.5 ms. For example, the off micro pulses in a micro pulsed plasma may last from at least 1.0 μs to at most 2.0 s, or from at least 2.0 μs to at most 1.0 s, or from at least 5.0 μs to at most 500 ms, or from at least 10.0 μs to at most 250.0 ms, or from at least 25.0 μs to at most 100.0 ms, or from at least 50.0 μs to at most 50.0 ms, or from at least 100.0 μs to at most 25.0 ms, or from at least 200.0 μs to at most 10.0 ms, or from at least 500.0 μs to at most 5.0 ms, or from at least 1.0 ms to at most 2.0 ms. A micro pulsed plasma may be used cyclically and/or as a post-deposition treatment. In other words, a process of filling a gap may feature alternating cycles of gap filling fluid deposition and micro pulsed plasma. Additionally or alternatively, a micro pulsed plasma may be applied as a post-deposition treatment after all gap filling fluid has been deposited.

Preferably, a micro pulsed plasma is applied together with a plasma gas flow rate that is higher than a pre-determined threshold. The combination of a micro pulsed plasma with these high flow rates minimizes redeposition of volatile byproducts released during plasma-induced cross linking of the deposited gap filling fluid. In some embodiments, the flow rate of the plasma gas during micro pulsed plasma treatment is at least 5.0 slm (standard liter per minute), preferably at least 10.0 slm. The skilled artisan understands that this flow rate depends on reactor chamber volume and substrate size, and the values provided here for 300 mm wafers and a reactor chamber volume of 1 liter can be readily transferred to other substrate sizes and/or reactor volumes. Preferably, a noble gas is used as a plasma gas during micro pulsed plasma treatment. In some embodiments, the noble gas is selected from the list consisting of He and Ar.

In some embodiments, the method includes entirely filling the plurality of recesses with a gap filling fluid.

In some embodiments, the method includes entirely filling the one or more lateral spaces with a gap filling fluid.

In some embodiments, the method includes filling the plurality of recesses and the one or more lateral spaces with gap filling fluid without the formation of voids. In other words, in some embodiments, the deposition according to the present methods is continued until the plurality of recesses and the one or more lateral spaces are fully filled with the film having filling capability, and substantially no voids are formed in the filled recess. The presence of voids can be observed by studying the formed films in a scanning transmission electron microscope.

In some embodiments, the co-reactant comprises nitrogen and/or ammonia. These one or more further gasses are commonly referred to as co-reactants.

In some embodiments, all gases supplied to the reaction space throughout any one of steps b to f are the precursor, an optional carrier such as $N_2$, Ar, and/or He, and an optional plasma ignition gas which can be or include Ar, He, $N_2$, and/or $H_2$.

In some embodiments, no gasses other than the precursor, ammonia, and nitrogen are introduced into the reactor throughout steps a to f.

In some embodiments, the co-reactant consists of any one of Ar, He, $H_2$, or any combination thereof. In some embodiments, the co-reactant comprises one or more gases which do not contain any nitrogen. Such co-reactants yield particularly good results in combination with a precursor selected from the list consisting of trisilylamine, dichlorosilane, trichlorosilane, and silicon alkylamines.

Silicon alkylamine precursors are particularly suitable to be used together with a plasma which is fed with a co-reactant selected from the list consisting of Ar, $N_2$, and He. Also, gap filling fluids resulting from depositions involving the use of these precursors and co-reactants are preferably subjected to a curing step involving a cyclic plasma treatment. In some embodiments, the cyclic plasma treatment involves the use of a gas mixture that does not comprise nitrogen. In some embodiments, the cyclic plasma treatment involves the use of noble gasses. In some embodiments, the cyclic plasma treatment involves the use of Ar and/or He.

In some embodiments, the precursor is selected from the list consisting of silazanes, cyclosilazanes, and silicon alkylamines. In some embodiments, the precursor is selected from the list consisting of Bis(diethylamino)silane, bisdimethylaminosilane, hexylethylaminosilane, tetraethylaminosilane, tertbutylaminosilane, bistert-butylaminosilena, bisdimethylaminodimethylaminosilane, heptametyhlsilazane, trimethysylyldiethylamine, trimethylsyledimethlamine, trimethyltoribinylcycletrisilazane, tristrimetylhydroxyamine, bisdimethylsaminomethylsilane, and dimetyhlsilyldimethlamine. These precursors are particularly suitable to be used together with a plasma which is fed with a co-reactant selected from the list consisting of Ar, $N_2$, and He. Also, gap filling fluids resulting from depositions involving the use of these precursors and co-reactants are preferably subjected to a curing step, as described elsewhere herein.

Preferably, the precursor is a cyclosilazane precursor. Gapfill layers using cyclosilazane precursors provide layers with particularly good lateral flowability, i.e., particularly good flowability in lateral spaces.

In some embodiments, the cyclosilazane precursor does not contain any oxygen.

In some embodiments, the cyclosilazane precursor does not contain any halogens.

In some embodiments, the cyclosilazane precursor is selected from the group consisting of a cyclotrisilazane precursor, a cyclotetrasilazane precursor, and a cyclopentasilazane precursor.

In some embodiments, the cyclosilazane precursor consists entirely of N, C, H, and Si. In some embodiments, the cyclosilazane precursor consists entirely of N, C, and Si.

In some embodiments, the cyclosilazane precursor has the structure of formula (i):

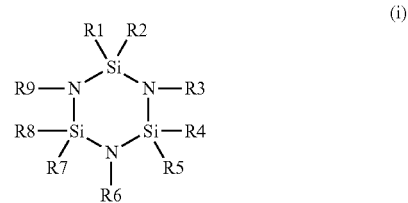

Preferably, any one of R1 to R9 are each independently selected from the group consisting of hydrogen and C1 to C5 branched or linear alkyl, alkenyl, alkynyl, and alkylamine.

In some embodiments, the cyclosilazane precursor has the structure of formula (ii):

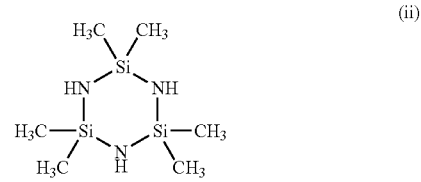

In some embodiments, the precursor comprises a trisilylamine (TSA). Such a precursor is particularly suitable to be used together with plasma which is fed with a co-reactant selected from the list consisting of $N_2$, $NH_3$, Ar, and He. Preferably, the one or more further gasses comprise 1) any one of $N_2$ and $NH_3$, combined with 2) any one of Ar and He.

In some embodiments, the precursor comprises a silicon alkylamine. For example, a suitable precursor is tetramethyl disalazane.

Silicon alkylamine precursors may be particularly suitable to be used together with a co-reactant selected from the list consisting of Ar, $N_2$, and He.

Without the present invention being bound by theory or any particular mode of operation, it is believed that the depositing material desirably remains viscous or liquid throughout the deposition process and should not readily solidify or evaporate. It is further believed that under desirable reaction conditions, the vapor pressure of the liquid phase, but not that of the precursor, should be lower than total reactor pressure. Thus, it is believed that reactor temperature and pressure should be maintained at conditions under which the flowable reaction products exist as a liquid, and the precursor exists as a gas.

In some embodiments, all of steps b to f occur at a pressure of at least 500 Pa, preferably at a pressure of at least 700 Pa. More preferably, all of steps b to f occur at a pressure of at least 900 Pa. This enhances the gap filling properties of the presently provided gap filling fluids.

In some embodiments, all of steps b to f occur at a temperature of at least −50° C. to at most 200° C., preferably at a temperature of at least 50° C. to at most 150° C. More preferably, all of steps b to f occur at a temperature of at least 50° C. to at most 75° C. This enhances the gap filling properties of the presently provided gap filling fluids.

In some embodiments, all of steps b to f occur at a pressure of at least 500 Pa to at most 10,000 Pa and at a temperature of at least −50° C. to at most 200° C. In some embodiments, all of steps b to f occur at a pressure of at least 700 Pa and at a temperature of at least 50° C. to at most 150° C. Preferably, all of steps b to f occur at a pressure of at least 900 Pa, and all of steps b to f occur at a temperature of at least 50° C. to at most 75° C. This specific combination of temperatures and pressures particularly enhances the gap filling properties of the presently provided gap filling fluids.

In some embodiments, the substrate comprises a semiconductor. In some embodiments, the semiconductor comprises silicon.

Further provided herein is a structure comprising a semiconductor substrate comprising a plurality of recesses. The plurality of recesses are in fluid connection with one or more lateral spaces. Also, the plurality of recesses and the one or more lateral spaces are at least partially filled with a gap filling fluid.

In some embodiments, the gap filling fluid completely fills at least 90%, preferably at least 95%, more preferably at least 99%, most preferably all of the plurality of recesses.

In some embodiments, the gap filling fluid completely fills at least 90%, preferably at least 95%, more preferably at least 99%, most preferably all of the lateral spaces. In other words, the gap filling fluid preferably fills the entirety of each lateral space that is to be filled with gap filling fluid.

In some embodiments, the gap filling fluid is substantially free of voids.

In some embodiments, the lateral spaces have a height of at least 1.0 nm to at most 40.0 nm, or at least 2.0 nm to at most 20.0 nm, or of at least 3.0 nm to at most 18.0 nm, or of at least 4.0 nm to at most 16.0 nm, or of at least 5.0 nm to at most 15.0 nm, or of at least 6.0 nm to at most 14.0 nm, or of at least 7.0 nm to at most 13.0 nm, or of at least 8.0 nm to at most 12.0 nm, or of at least 9.0 nm to at most 11.0 nm, or of about 10.0 nm.

In some embodiments, the gap filling fluid extends in the lateral space for a distance of at least 1.0 nm to at most 200.0 nm, or from at least 1.5 nm to at most 150.0 nm, or from at least 2.0 nm to at most 100.0 nm, or from at least 2.5 nm to at most 50.0 nm, or from a distance of at least 3.0 nm to at most 25.0 nm, or from a distance of at least 4.0 nm to at most 20.0 nm, or from a distance of at most 5.0 nm to at most 18.0 nm, or from a distance of at least 6.0 nm to at most 16.0 nm, or from a distance of at least 7.0 nm to at most 14.0 nm, or from a distance of at least 8.0 nm to at most 12.0 nm, or for a distance of about 10.0 nm.

In some embodiments, the gap filling fluid extends in the lateral space for a distance of at least 3 nm, or for a distance of at least 5.0 nm, or for a distance of at least 10.0 nm, or for a distance of at least 25 nm, or for a distance of at least 50 nm, or for a distance of at least 100 nm, or for a distance of at least 250 nm, or for a distance of at least 500 nm, or for a distance of at least 1 µm.

In some embodiments, the recess has a depth of at least 5 nm to at most 500 nm, or of at least 10 nm to at most 250 nm, or from at least 20 nm to at most 200 nm, or from at least 50 nm to at most 150 nm, or from at least 100 nm to at most 150 nm.

In some embodiments, the recess has a width of at least 10 nm to at most 10,000 nm, or of at least 20 nm to at most 5,000 nm, or from at least 40 nm to at most 2,500 nm, or from at least 80 nm to at most 1000 nm, or from at least 100 nm to at most 500 nm, or from at least 150 nm to at most 400 nm, or from at least 200 nm to at most 300 nm.

In some embodiments, the recess has a length of at least 10 nm to at most 10,000 nm, or of at least 20 nm to at most 5,000 nm, or from at least 40 nm to at most 2,500 nm, or from at least 80 nm to at most 1000 nm, or from at least 100 nm to at most 500 nm, or from at least 150 nm to at most 400 nm, or from at least 200 nm to at most 300 nm.

In some embodiments, the gap filling fluid extends into a particular recess for a distance that equals from at least 1.0 to at most 10.0 times the height of the recess. In some embodiments, the gap filling fluid extends into a particular recess for a distance that equals from at least 1.5 to at most 9.0 times the height of the recess. In some embodiments, the gap filling fluid extends into a particular recess for a distance that equals from at least 2.0 to at most 8.0 times the height of the recess. In some embodiments, the gap filling fluid extends into a particular recess for a distance that equals from at least 3.0 to at most 6.0 times the height of the recess. In some embodiments, the gap filling fluid extends into a particular recess for a distance that equals from at least 4.0 to at most 6.0 times the height of the recess. In some embodiments, the gap filling fluid extends into a particular recess for a distance that equals about 5.0 times the height of the recess.

In some embodiments, the gap filling fluid comprises a polysilazane oligomer.

In some embodiments, the polysilazane oligomer is branched.

In some embodiments, the polysilazane oligomer comprises a plurality of oligomeric species.

In some embodiments, the structure comprises a plurality of lateral spaces, wherein the lateral spaces are present in the source and/or drain regions of gate-all-around transistors, and wherein the gap filling fluid serves as an interlayer dielectric.

In some embodiments, the gap filling fluid is cured. The term "curing" refers a process of cross linking of as-deposited gap filling fluid oligomers. Suitable means of curing include plasma curing processes as described herein.

In some embodiments, the cured gap filling fluid consists entirely of Si, N, H, and C. In some embodiments, the cured gap filling fluid consists entirely of Si, N, and C.

Preferably, the cured gap filling fluid is a thermoset resin.

Further provided is a structure formed by a method as described herein.

The present methods and structures involve the manufacture and/or the provision of a gap filling fluid. Such a gap filling fluid, i.e., a fluid having filling capability, can be applied to various semiconductor devices including, but not limited to, cell isolation in 3D cross point memory devices, self-aligned via, dummy gate (replacement of current poly Si), reverse tone patterning, PC RAM isolation, cut hard mask, and DRAM storage node contact (SNC) isolation.

Further provided is a gate all around transistor comprising a gap filling fluid as an interlayer dielectric.

In some embodiments, the gap filling fluid is cured, preferably, the gap filling fluid is cured by means of a method as described herein.

Further provided is the use of a gap filling fluid as an interlayer dielectric in a gate all around transistor. Gate All Around transistors and interlayer dielectrics as such are known in the art, and are described, for example, in U.S. Pat. No. 9,087,915.

Further provided is the use of a cured gap filling fluid as an interlayer dielectric in a gate all around transistor.

Further provided is a system configured to perform a method as described herein and/or configured to form a structure as described herein.

Further provided is a system comprising: one or more reaction chambers; a gas injection system fluidly coupled to at least one of the one or more reaction chambers; a first gas source for introducing a precursor and optionally a carrier gas in one or more reactor chambers; a second gas source for introducing a mixture of one or more further gasses into one or more reactor chambers; an exhaust; and a controller, wherein the controller is configured to control gas flow into the gas injection system to carry out a method as described herein.

In some embodiments, the gas injection system comprises a precursor delivery system that employs a carrier gas for carrying the precursor to one or more reactor chambers. In some embodiments, continuous flow of carrier gas is accomplished using a flow-pass system, wherein a carrier gas line is provided with a detour line having a precursor reservoir (bottle), and the main line and the detour line are switched, wherein when only a carrier gas is intended to be fed to a reaction chamber, the detour line is closed, whereas when both the carrier gas and the precursor gas are intended to be fed to the reaction chamber, the main line is closed and the carrier gas flows through the detour line and flows out from the bottle together with the precursor gas. In this way, the carrier gas can continuously flow into the reaction chamber and can carry the precursor gas in pulses by switching the main line and the detour line.

The skilled artisan will appreciate that the apparatus includes one or more controller(s) (not shown) programmed or otherwise configured to cause the deposition and reactor cleaning process described elsewhere herein to be conducted. The controller(s) are communicated with the various power sources, heating systems, pumps, robotics, and gas flow controllers or valves of the reactor, as will be appreciated by the skilled artisan.

In the present disclosure, where conditions and/or structures are not specified, the skilled artisan in the art can readily provide such conditions and/or structures in view of the present disclosure, as a matter of routine experimentation.

The example embodiments of the disclosure described herein not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

As an example of a use case, the present gap fill layer can be used as an interlayer in gate all around transistors.

As an example of another use case, the present gap fill layer can be used as a dielectric filling layer above self-aligned contacts.

The presently provided methods may be executed in any suitable apparatus, including in a reactor as shown in FIG. 1. Similarly, the presently provided structures may be manufactured in any suitable apparatus, including a reactor as shown in FIG. 1. FIG. 1 is a schematic view of a PEALD apparatus, desirably in conjunction with controls programmed to conduct the sequences described below, usable in some embodiments of the present invention. In this figure, by providing a pair of electrically conductive flat-plate electrodes (2,4) in parallel and facing each other in the interior (11) (reaction zone) of a reaction chamber (3), applying RF power (e.g., at 13.56 MHz or 27 MHz) from a power source (25) to one side, and electrically grounding the other side (12), a plasma is excited between the electrodes. A temperature regulator may be provided in a lower stage (2), i.e., the lower electrode. A substrate (1) is placed thereon and its temperature is kept constant at a given temperature. The upper electrode (4) can serve as a shower plate as well, and a reactant gas and/or a dilution gas, if any, as well as a precursor gas can be introduced into the reaction chamber (3) through a gas line (21) and a gas line (22), respectively, and through the shower plate (4). Additionally, in the reaction chamber (3), a circular duct (13) with an exhaust line (17) is provided, through which the gas in the interior (11) of the reaction chamber (3) is exhausted. Additionally, a transfer chamber (5) is disposed below the reaction chamber (3) and is provided with a gas seal line (24) to introduce seal gas into the interior (11) of the reaction chamber (3) via the interior (16) of the transfer chamber (5) wherein a separation plate (14) for separating the reaction zone and the transfer zone is provided. Note that a gate valve through which a wafer may be transferred into or from the transfer chamber (5) is omitted from this figure. The transfer chamber is also provided with an exhaust line (6). In some embodiments, the deposition of multi-element film and surface treatment are performed in the same reaction space, so that all the steps can continuously be conducted without exposing the substrate to air or other oxygen-containing atmosphere.

Figure 2:
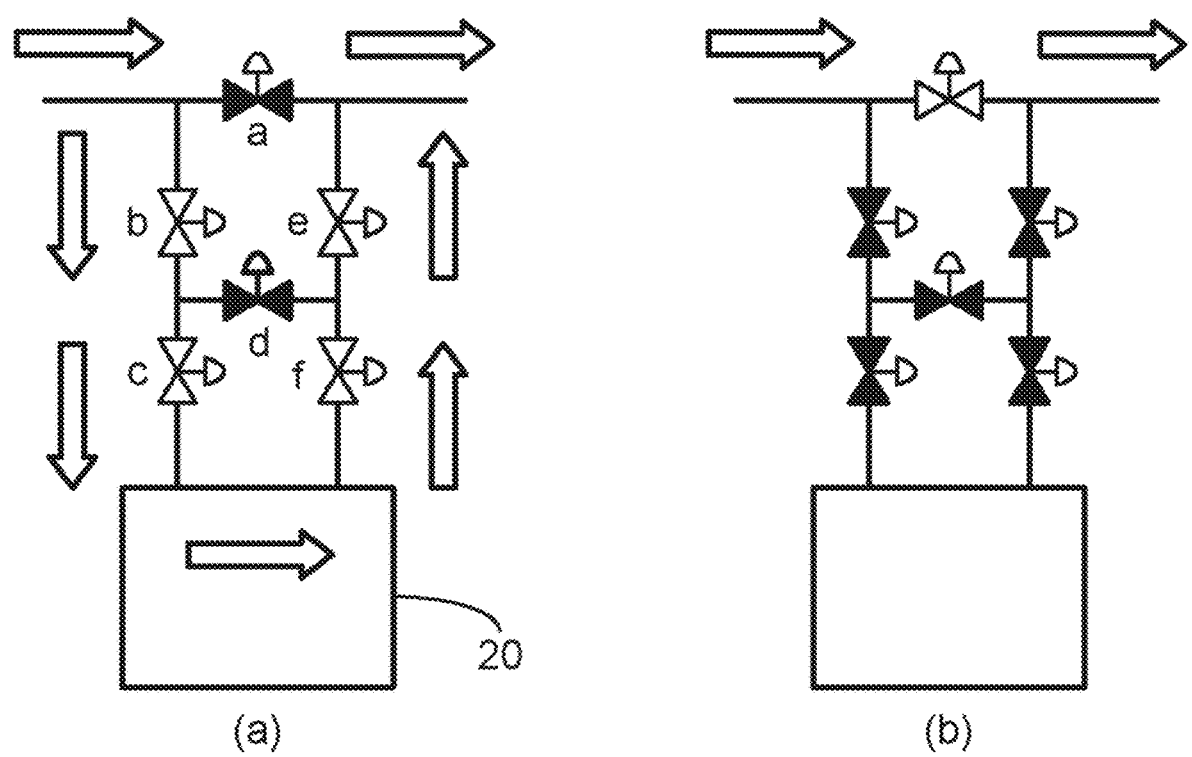
FIG. 2 illustrates a schematic representation of a precursor supply system using a flow-pass system (FPS) usable in accordance with at least one embodiment of the present disclosure.

In some embodiments, the apparatus depicted in FIG. 1, the system of switching flow of an inactive gas and flow of a precursor gas illustrated in FIG. 2 can be used to introduce the precursor gas in pulses without substantially fluctuating pressure of the reaction chamber.

Indeed, a continuous flow of the carrier gas can be accomplished using a flow-pass system (FPS) wherein a carrier gas line is provided with a detour line having a precursor reservoir (bottle), and the main line and the detour line are switched, wherein when only a carrier gas is intended to be fed to a reaction chamber, the detour line is closed, whereas when both the carrier gas and a precursor gas are intended to be fed to the reaction chamber, the main line is closed and the carrier gas flows through the detour line and flows out from the bottle together with the precursor gas. In this way, the carrier gas can continuously flow into the reaction chamber and can carry the precursor gas in pulses by switching the main line and the detour line. FIG. 2 illustrates a precursor supply system using a flow-pass system (FPS) according to an embodiment of the present invention (black valves indicate that the valves are closed). As shown in (a) in FIG. 2, when feeding a precursor to a reaction chamber (not shown), first, a carrier gas such as Ar (or He) flows through a gas line with valves b and c, and then enters a bottle (reservoir) (20). The carrier gas flows out from the bottle (20) while carrying a precursor gas in an amount corresponding to a vapor pressure inside the bottle (20) and flows through a gas line with valves f and e and is then fed to the reaction chamber together with the precursor. In the above, valves a and d are closed. When feeding only the carrier gas (noble gas) to the reaction chamber, as shown in (b) in FIG. 2, the carrier gas flows through the gas line with the valve a while bypassing the bottle (20). In the above, valves b, c, d, e, and f are closed.

A skilled artisan will appreciate that the apparatus includes one or more controller(s) (not shown) programmed or otherwise configured to cause the deposition and reactor cleaning process described elsewhere herein to be conducted. The controller(s) are communicated with the various power sources, heating systems, pumps, robotics and gas flow controllers or valves of the reactor, as will be appreciated by the skilled artisan.

Optionally, a dual chamber reactor can be used. A dual chamber reactor comprises two sections or compartments for processing wafers disposed close to each other. In such a dual chamber reactor, a reactant gas and a noble gas can be supplied through a shared line and precursor-containing gases are provided by means of unshared lines.

In a further example, reference is made to FIG. 3, which shows an exemplary test structure (100). The test structure was used to demonstrate the efficacy of a gap filling fluid, more particularly an SICN layer, with excellent lateral flowability. The SICN layer in this example comprises a plurality of branched polysilazane oligomeric species. It was deposited using process conditions 2, as shown in Table 1, and using the following precursor molecule:

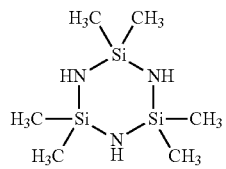

In a further example, an exemplary method as provided herein is discussed. The method is directed to filling a gap in a silicon wafer. The gap comprises a recess and a lateral space in fluid connection with the recess. The method comprises at least partially filling the recess and the lateral space with a gap filling fluid. Preferably, recess and the lateral space are entirely filled with the gap filling fluid.

At least partially filling the gap with a gap filling fluid may comprise: introducing in a reactor chamber a substrate provided with a gap, the gap comprising a recess and a lateral space extending substantially laterally from the recess; introducing a precursor into the reactor chamber; introducing a co-reactant into the reactor chamber; and, introducing a plasma in the reactor chamber; whereby the precursor and the co-reactant react to form a gap filling fluid in the recess and the lateral space of the gap.

The co-reactant may comprise nitrogen and/or ammonia, and the precursor may be a cyclosilazane precursor that has a structure according to the following formula:

TABLE 1

| con-dition | deposition cycles | $NH_3$ flow | $N_2$ carrier gas flow (slpm) | Reactor pressure (Pa) | plasma power (W) | electrode gap (mm) | $N_2$ gas flow (slpm) | pre-cursor feed time | pre-cursor purge time (s) | RF-on time | post purge time | susceptor temp. (° C.) | top GPC (nm/cycle) | bottom GPC (nm/cycle) | top GPC/bottom GPC |
|---|---|---|---|---|---|---|---|---|---|---|---|---|---|---|---|
| 1 | 46 | 0 | 0.4 | 1000 | 300 | 15 | 0.5 | 2 | 0.2 | 1 | 1 | 65 | 0.03 | 1.1 | 0.03 |
| 2 | 63 | 0.2 | 0.4 | 1800 | 500 | 7 | 0.5 | 2 | 0.2 | 1 | 1 | 75 | 0.02 | 1.2 | 0.01 |
| 3 | 52 | 0.2 | 0.4 | 1800 | 500 | 15 | 0.5 | 1.25 | 0.2 | 2 | 1 | 75 | 0.02 | 1.63 | 0.01 |
| 4 | 15 | 0 | 0.7 | 1800 | 500 | 7 | 0.5 | 0.5 | 0.2 | 1 | 1 | 75 | 0.26 | 2.98 | 0.09 |
| 5 | 14 | 0 | 0.7 | 1800 | 500 | 15 | 0.5 | 2 | 0.2 | 2 | 1 | 75 | 0.04 | 1.47 | 0.03 |
| 6 | 79 | 0.2 | 0.7 | 1250 | 500 | 15 | 0.5 | 0.5 | 0.2 | 1 | 1 | 75 | 0.04 | 1.39 | 0.03 |
| 7 | 112 | 0.2 | 0.7 | 1800 | 300 | 7 | 0.5 | 2 | 0.2 | 2 | 1 | 75 | 0.01 | 0.85 | 0.02 |

In the test structure (100), gap filling fluid (110) fills a trench (140). Also, the gap filling fluid (100) fully fills a lateral space (130). The width $w_t$ of the trench equals 210 nm. The height of the trench (140) equals 445 nm. The height $h_t$ of the lateral space (130) equals 36 nm. The width $w_v$ of the lateral space (130) filled with gap filling fluid (100) is 160 nm. This corresponds to the total width of the lateral space (130) and thus 160 nm is a lower limit of the lateral gap filling capability of the gap filling fluid used in this example, for a lateral space (130) with a height of 36 nm.

Figure 4:
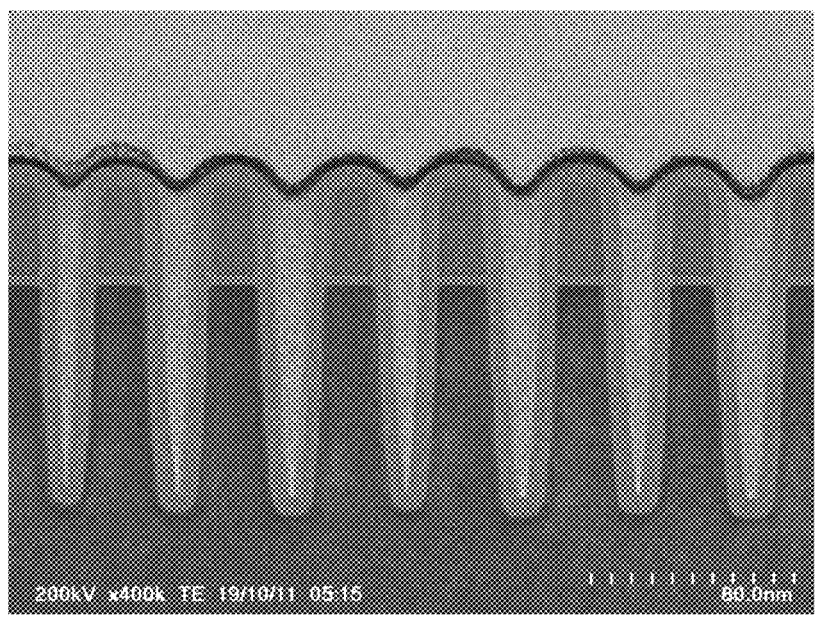
FIG. 4 shows further details on the filling capability of some embodiments of gap filling fluids used to fill gaps in accordance with at least some embodiments of the methods described herein.

In a further example, reference is made to FIG. 4. Process condition 3 from Table 1 was used, it shows vertical filling capability in a narrow and high aspect ratio structure.

Figure 5:
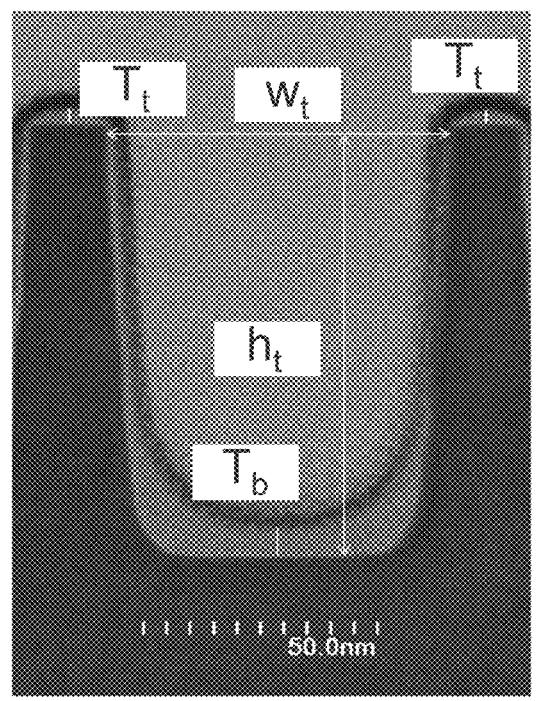
FIG. 5 illustrates how top growth per cycle and bottom growth per cycle are measured.

In a further example, reference is made to FIG. 5. This figure shows how the thickness $T_t$ of gap fill fluid deposited on the top of a sample and the thickness $T_b$ of gap fill fluid deposited in the bottom of a trench may be measured by means of thickness measurements using scanning transmission electron microscopy (STEM) on a sample cross section. The ratio of the thickness $T_t$ of gap fill fluid deposited on the top of the sample and the thickness $T_b$ of gap fill fluid deposited in the bottom of a trench yields the ratio of growth per cycle at the top of the sample and the growth per cycle at the bottom of the cycle. A value close to zero, or at least smaller than one, indicates good flowability.

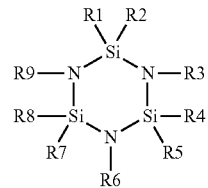

wherein any one of R1 to R9 are each independently selected from the group consisting of hydrogen and C1 to C5 branched or linear alkyl, alkenyl, alkynyl, and alkylamine.

No gasses other than the cyclosilazane precursor, ammonia, and nitrogen may be introduced into the reactor. Also, a pressure in the reactor may be at least 900 Pa to at most 1,800 Pa and a temperature in the reactor may be at least 50° C. to at most 75° C.

Further provided herein is a structure comprising a semiconductor substrate comprising a plurality of recesses. The plurality of recesses are in fluid connection with one or more lateral spaces, and the plurality of recesses and the one or more lateral spaces are filled with a gap filling fluid which may be cured. The gap filling fluid is substantially free of voids.

The lateral spaces may have a height of at least 1.0 nm to at most 40.0 nm. The gap filling fluid may extend in the lateral space for a distance of at least 5.0 nm. The recesses may have a depth of at least 5 nm to at most 500 nm, a width of at least 10 nm to at most 10,000 nm, and a length of at least 10 nm to at most 10,000 nm.

The gap filling fluid may comprise a branched polysilazane oligomer comprising a plurality of oligomeric species. In other words, the branched polysilazane oligomer may comprise a plurality different macromolecules that have a varying morphology.

As a further example, an exemplary curing step is discussed. The curing step may employ a continuous direct plasma for 20 seconds. Gap filling fluid deposition steps and this direct plasma curing step may be carried out cyclically. This allows efficiently curing all, or at least a large portion, of the gap filling fluid. For curing gap filling fluid in gaps on a 300 mm substrate, each direct plasma curing step features 20 seconds of He plasma at an RF power of 200 W and a working pressure of 600 Pa. The reactor volume is ca. 1 liter and the He flow rate is 2 slm.

As a further example, another exemplary curing step is discussed. The curing step may involve the use of a micro pulsed plasma. In the present example, the curing step may be carried out cyclically, i.e., alternating cycles of gap filling fluid deposition and micro pulsed RF plasma are employed, though a post-deposition micro plasma curing treatment is possible as well. The application of cyclic gap filling fluid deposition and plasma steps allows efficiently curing all, or at least a large portion, of the gap filling fluid. For curing gap filling fluid in gaps on a 300 mm substrate, each direct curing step may feature 200 micropulses comprising 0.1 seconds of plasma on time and 0.5 seconds of plasma off time. The curing step may employ a He plasma at 400 Pa. The RF power provided may be 200 W. A He flow of 10 slm may be employed.

The gap filling fluid may comprise a branched polysilazane oligomer comprising a plurality of oligomeric species. In other words, the branched polysilazane oligomer comprises a plurality of different macromolecules that may have a varying morphology.

Figure 6:
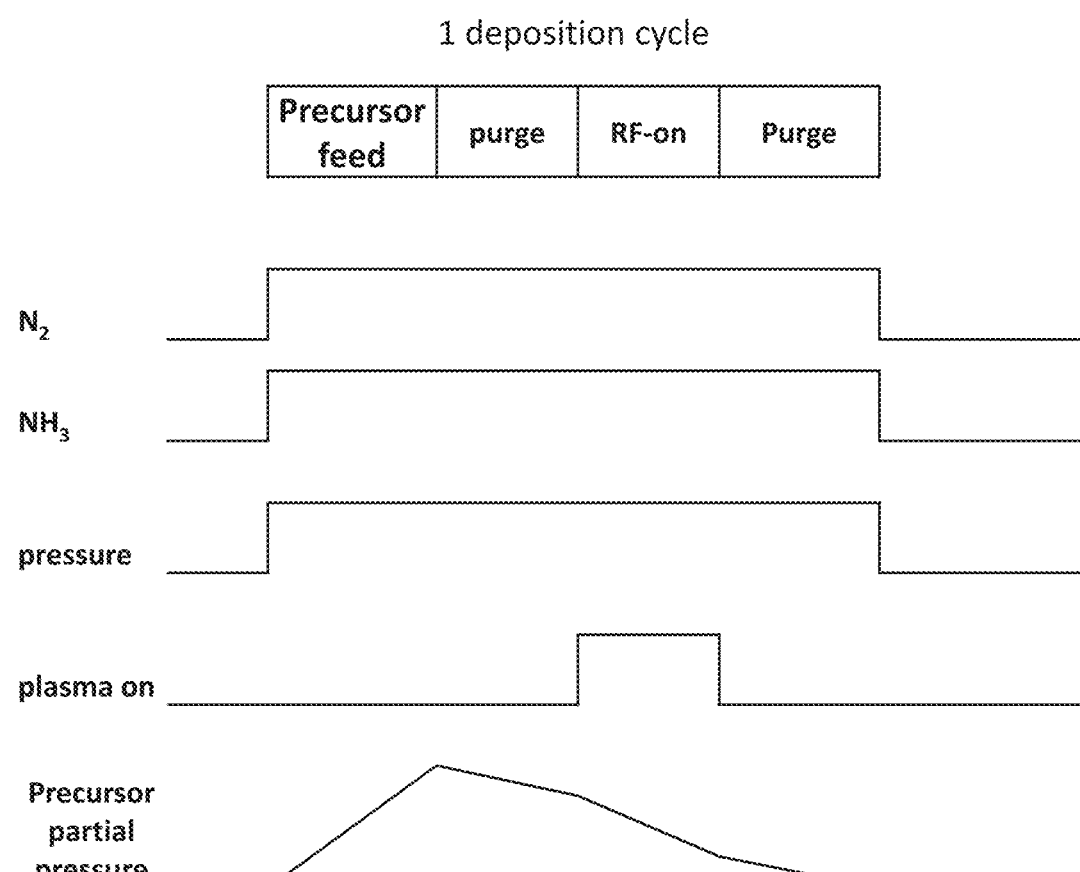
FIG. 6 illustrates an embodiment of a single gap filling fluid deposition cycle when $N_2$ and $NH_3$ are used as co-reactants.

In a further example, reference is made to FIG. 6 and Table 1.

FIG. 6 shows a deposition cycle sequence of an exemplary gap filling fluid deposition process. The process may employ a gas mixture consisting of nitrogen and ammonia as a co-reactant. The co-reactant is continuously provided to the reactor chamber at a constant flow rate. Precursor pulses and RF on pulses may be applied sequentially, and may be separated by purge pulses. Table 1 shows exemplary process conditions which yield particularly good results for 300 mm substrates. In this table: the column "condition" shows process condition references; the column "deposition cycles" shows the number of depositions cycles for every process condition; the column "$NH_3$ flow" shows the ammonia flow rate in standard liters per minute (slpm) for each process condition; the column "$N_2$ carrier gas flow" shows the dinitrogen carrier gas flow rate, i.e., the flow rate of dinitrogen provided together with the precursor, in slpm for each process condition; the column "reactor pressure" shows the reactor chamber pressure in Pa for each process condition; the column "plasma power" shows the RF plasma used for each process condition in W; the column "electrode gap" shows distance between the electrodes between which the RF plasma is generated, in mm; the column "$N_2$ gas flow" shows the gas flow rate of dinitrogen that is additionally provided to the reactor chamber, above and beyond what is provided as carrier gas, in slpm, and for each process condition; the column "precursor feed time" shows the time in seconds during which the precursor provided during each deposition cycle; the column "precursor purge time" shows the time during which only the co-reactants, i.e., $N_2$ and $NH_3$, are provided to the reactor chamber without the application of plasma after each precursor feed pulse; the column "RF on time" shows the time during which RF power is provided during each deposition cycle, for each process condition, in seconds; the column "post purge time" shows the time during which only the co-reactants, i.e., $N_2$ and $NH_3$, are provided to the reactor chamber without the application of plasma after each plasma on pulse, in seconds; the column "top GPC" shows the top growth per cycle in nm/cycle, for each process condition; the column "bottom GPC" shows the bottom growth per cycle in nm/cycle, for each process condition; the column "top GPC/bottom GPC" shows the ratio of top growth per cycle and bottom growth per cycle for each process condition.

Figure 7:
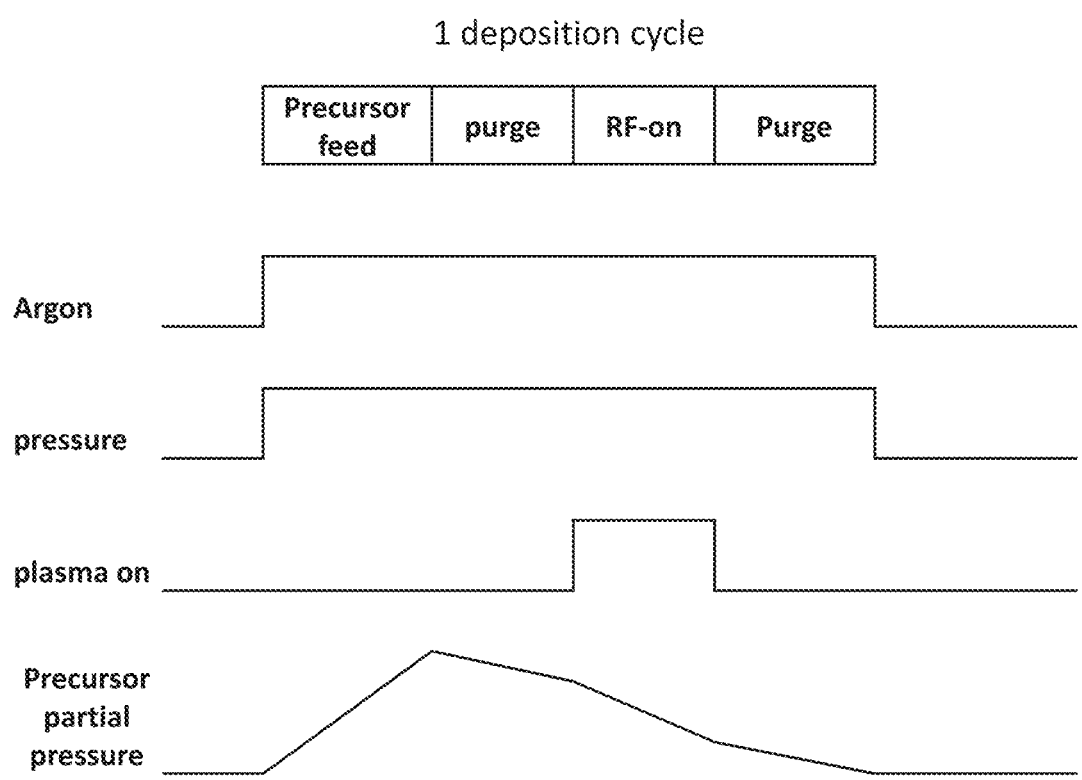
FIG. 7 illustrates an embodiment of a single gap filling fluid deposition cycle when Ar is used as a co-reactant.

FIG. 7 shows a deposition cycle sequence of an exemplary gap filling fluid deposition process. The process employs a gas mixture consisting argon as a co-reactant. The co-reactant may be continuously provided to the reactor chamber at a constant flow rate. Precursor pulses and RF on pulses are applied sequentially, and are separated by purge pulses. Table 2 shows exemplary process conditions which yield particularly good results for 300 mm substrates. In this table, the legends of the columns have a similar meaning as those of Table 1, mutatis mutandis.

TABLE 2

| condition | deposition cycle | Ar carrier gas flow (slpm) | Reactor pressure (Pa) | plasma power (W) | electrode gap (mm) | Ar gas flow (slpm) | precursor feed time | precursor purge time (s) | RF-on time | post purge time | susceptor temp. (° C.) | top GPC | bottom GPC | top GPC/ bottom GPC |
|---|---|---|---|---|---|---|---|---|---|---|---|---|---|---|
| Ar.01 | 268 | 0.9 | 1800 | 75 | 7 | 0 | 1 | 0.2 | 0.7 | 1 | 65 | 0.01 | 0.23 | 0.04 |
| Ar.02 | 39 | 0.4 | 1000 | 75 | 15 | 0 | 1 | 0.2 | 1.5 | 1 | 65 | 0.06 | 1.88 | 0.03 |
| Ar.03 | 65 | 0.9 | 1400 | 75 | 15 | 0 | 1 | 0.2 | 1.5 | 1 | 65 | 0.03 | 1.44 | 0.02 |
| Ar.04 | 98 | 0.9 | 1000 | 75 | 15 | 1 | 1 | 0.2 | 0.7 | 1 | 65 | 0.06 | 0.61 | 0.10 |
| Ar.07 | 155 | 0.4 | 1400 | 150 | 15 | 1 | 1 | 0.2 | 1.5 | 1 | 75 | 0.14 | 2.41 | 0.06 |
| Ar.08 | 30 | 0.9 | 1400 | 150 | 15 | 0 | 1 | 0.2 | 0.7 | 1 | 75 | 0.03 | 0.22 | 0.14 |
| Ar.10 | 38 | 0.9 | 1800 | 75 | 15 | 1 | 1 | 0.2 | 1.5 | 1 | 75 | 0.07 | 1.16 | 0.06 |
| Ar.11 | 61 | 0.4 | 1400 | 150 | 7 | 0 | 1 | 0.2 | 1.5 | 1 | 75 | 0.07 | 0.87 | 0.08 |
| Ar.13 | 59 | 0.9 | 1800 | 150 | 7 | 0 | 1 | 0.2 | 1.5 | 1 | 75 | 0.06 | 1.87 | 0.03 |

What is claimed is:

1. A method of filling a gap comprising:
introducing in a reactor chamber a substrate provided with a gap;
introducing a precursor into the reactor chamber;
introducing a co-reactant into the reactor chamber; and, generating a plasma in the reactor chamber; whereby the precursor and the co-reactant react to form a gap filling fluid that at least partially fills the recess, wherein the method comprises a plurality of cycles, a cycle comprising a gap filling fluid deposition step and a curing step, wherein the curing step comprises subjecting the substrate to a direct plasma; and wherein the curing step comprises subjecting the substrate to a micro pulsed plasma comprising a plurality of micro pulse cycles, a micro pulse cycle comprising a plasma on pulse and a plasma off pulse.

2. The method according to claim 1, wherein the co-reactant comprises at least one of nitrogen and ammonia.

3. The method according to claim 1, wherein the co-reactant comprises a noble gas.

4. The method according to claim 3, wherein the noble gas comprises Ar.

5. The method according to claim 1, wherein the precursor comprises a cyclosilazane precursor.

6. The method according to claim 5, wherein the cyclosilazane precursor is selected from the group consisting of a cyclotrisilazane precursor, a cyclotetrasilazane precursor, and a cyclopentasilazane precursor.

7. The method according to claim 5, wherein the cyclosilazane precursor has the structure of formula (i):

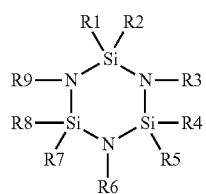

wherein any one of R1 to R9 are each independently selected from the group consisting of hydrogen and C1 to C5 branched or linear alkyl, alkenyl, alkynyl, and alkylamine.

8. The method according to claim 5, wherein the cyclosilazane precursor does not contain any oxygen.

9. The method according to claim 5, wherein the cyclosilazane precursor does not contain any halogens.

10. The method according to claim 1, wherein the reactor chamber is maintained at a pressure of at least 900 Pa to at most 1200 Pa.

11. The method according to claim 1, wherein the reactor chamber is maintained at a temperature of at least 50° C. to at most 75° C.

12. The method according to claim 1, wherein introducing the precursor and the co-reactant overlap.

13. The method according to claim 1, wherein the co-reactant is provided continuously, wherein the precursor is provided in a plurality of precursor pulses, wherein the plasma is generated in a plurality of plasma pulses, and wherein the precursor pulses and the plasma pulses are separated by purge steps.

14. The method according to claim 1, wherein no gasses other than the cyclosilazane precursor, ammonia, and nitrogen are introduced into the reactor chamber while introducing the precursor, introducing the co-reactant, and generating the plasma.

15. The method according to claim 1, wherein the direct plasma is a noble gas plasma.

16. The method according to claim 1, wherein the substrate is a 300 mm silicon wafer, and wherein a plasma gas flow rate of at least 5.0 slm is maintained during the micro pulsed plasma.

17. The method according to claim 1, wherein the method comprises curing the gap filling fluid, and wherein curing the gap filling fluid comprises subjecting the substrate to an indirect plasma after the gap has been filled with the gap filling fluid.

18. A system comprising:
one or more reaction chambers;
a gas injection system fluidly coupled to at least one of the one or more reaction chambers;
a first gas source for introducing a precursor and optionally a carrier gas in the reactor chamber;
a second gas source for introducing a mixture of one or more further gasses into the reactor chamber;
an exhaust; and
a controller,
wherein the controller is configured to control gas flow into the gas injection system to carry out a method according to claim 1.

* * * * *